(12) United States Patent
Koch (10) Patent No.: US 11,045,008 B2
(45) Date of Patent: Jun. 29, 2021

(54) PRESENCE DETECTION SYSTEM FOR AN ELECTRICALLY ADJUSTABLE FURNITURE ASSEMBLY AND METHOD OF PRESENCE DETECTION WITH AN ELECTRICALLY ADJUSTABLE FURNITURE ASSEMBLY

(71) Applicant: LOGICDATA Electronic & Software Entwicklungs GmbH, Deutschlandsberg (AT)

(72) Inventor: Walter Koch, Schwanberg (AT)

(73) Assignee: LOGICDATA ELECTRONICS & SOFTWARE ENTWICKLUNGS GMBH, Deutschlandsberg (AT)

( * ) Notice: Subject to any disclaimer, the term of this patent is extended or adjusted under 35 U.S.C. 154(b) by 143 days.

(21) Appl. No.: 16/339,707

(22) PCT Filed: Aug. 4, 2017

(86) PCT No.: PCT/EP2017/069835
§ 371 (c)(1),
(2) Date: Apr. 4, 2019

(87) PCT Pub. No.: WO2018/065142
PCT Pub. Date: Apr. 12, 2018

(65) Prior Publication Data
US 2020/0037775 A1 Feb. 6, 2020

Related U.S. Application Data

(60) Provisional application No. 62/404,427, filed on Oct. 5, 2016.

(51) Int. Cl.
*A47C 20/04* (2006.01)
*A47C 17/04* (2006.01)
(Continued)

(52) U.S. Cl.
CPC .............. *A47C 20/041* (2013.01); *A47C 1/02* (2013.01); *A47C 17/04* (2013.01); *H03K 17/955* (2013.01)

(58) Field of Classification Search
CPC ......... A47C 20/041; A47C 1/02; A47C 17/04; H03K 17/955; H03K 17/975
See application file for complete search history.

(56) References Cited

U.S. PATENT DOCUMENTS

| 2016/0081865 A1* | 3/2016 | Brosnan | .................. | A61G 7/018 700/275 |
| 2016/0161623 A1* | 6/2016 | Chacon | .................. | G01V 3/088 324/679 |

(Continued)

FOREIGN PATENT DOCUMENTS

| WO | WO 02/11585 A1 | 2/2002 | |
| WO | WO-2016131639 A1 * | 8/2016 | ....... B60R 21/01532 |

*Primary Examiner* — Christopher P McAndrew
*Assistant Examiner* — Zannatul Ferdous
(74) *Attorney, Agent, or Firm* — Morgan, Lewis & Bockius LLP (57) ABSTRACT

A presence detection system for an electrically adjustable furniture assembly is disclosed. The presence detection system comprises at least one steady element and at least one movable element, articulatedly and/or slidably connected to the at least one steady element wherein at least one of the steady elements and/or at least one of the movable elements comprise an electrically conducting element. The presence detection system further comprises at least one actuator, arranged to electrically adjust at least one of the movable elements and at least one capacitance detecting unit, electrically connected to the at least one electrically conducting element, arranged to detect a capacitance value of the at least one electrically conducting element. The presence detection system also comprises at least one control unit, electrically connected to the at least one actuator and the at least one (Continued)

capacitance detecting unit, wherein the at least one control unit is arranged to provide a control signal to stop and/or reverse an adjusting movement at least in part when the at least one capacitance detecting unit detects a capacitance value of at least one of the electrically conducting elements higher than a predetermined capacitance threshold value.

15 Claims, 4 Drawing Sheets

(51) Int. Cl.
*A47C 1/02* (2006.01)
*H03K 17/955* (2006.01)

(56) References Cited

U.S. PATENT DOCUMENTS

2016/0331614 A1* 11/2016 Furman ................ A61G 7/0506
2017/0199022 A1* 7/2017 Anderson ............. G06F 3/0445

* cited by examiner

PRESENCE DETECTION SYSTEM FOR AN ELECTRICALLY ADJUSTABLE FURNITURE ASSEMBLY AND METHOD OF PRESENCE DETECTION WITH AN ELECTRICALLY ADJUSTABLE FURNITURE ASSEMBLY

BACKGROUND OF THE INVENTION

The invention relates to a presence detection system for an electrically adjustable furniture assembly comprising at least one steady element and at least one movable element. The movable element is articulatedly and/or slidably connected to the at least one steady element. The invention further relates to a method of presence detection with such electrically adjustable furniture assembly.

Electrically adjustable furniture assemblies with steady and movable elements bear the risk of pinching, for example a hand of a person, while adjusting the movable elements. To avoid such risk, presence detection systems are used to detect a presence of an extremity of a person or an animal in a dangerous zone of the furniture assembly. Those presence detection systems, however, are often not very reliable and prone to false detections.

SUMMARY OF THE INVENTION

The present disclosure provides an improved presence detection system for an electrically adjustable furniture assembly and an improved method of presence detection with an electrically adjustable furniture assembly.

According to a first aspect, a presence detection system for an electrically adjustable furniture assembly comprising at least one steady element and at least one movable element is disclosed. The at least one movable element is articulatedly and/or slidably connected to the at least one steady element. At least one of the steady elements and/or at least one of the movable elements comprise an electrically conducting element. The presence detection system further comprises at least one actuator, arranged to electrically adjust at least one of the movable elements and at least one capacitance detecting unit, electrically connected to the at least one electrically conducting element. The at least one capacitance detecting unit is arranged to detect a capacitance value of the at least one electrically conducting element. The presence detection system further comprises at least one control unit, electrically connected to the at least one actuator and the at least one capacitance detecting unit. The at least one control unit is arranged to provide a control signal to stop and/or reverse an adjusting movement at least in part when the at least one capacitance detecting unit detects a capacitance value of at least one of the electrically conducting elements higher than a predetermined capacitance threshold value.

An advantage of this presence detection system is that the at least one capacitance detecting unit detects a capacitance value of the at least one electrically conducting element. If a person approaches a dangerous area, where for example a hand of the person could be pinched by a movable element of the furniture assembly, the capacitance detecting unit detects a change of the capacity of at least one of the electrically conducting elements. Pinching of the person's hand is avoided by stopping and/or reversing an adjusting movement of the movable element at least in part, when the capacitance detecting unit detects a capacitance value higher than a predetermined capacitance threshold value. The predetermined capacitance threshold value can be set to a value, which guarantees to avoid harming a person in the dangerous area but also to avoid stopping and/or reversing the adjusting movement in case of a minor fluctuation of the detected capacitance value, caused by a non-dangerous circumstance.

In an embodiment of the presence detection system, the electrically adjustable furniture assembly is one of the following: an electrically adjustable bed, an electrically adjustable sofa, or an electrically adjustable recliner.

In at least one embodiment of the presence detection system, the electrically conducting element is an additional element, attached to the at least one steady element and/or the at least one movable element. An advantage of an additional element as electrically conducting element is that the additional element can be attached to the steady and/or movable elements exactly where it is needed. Form and size of the additional elements may be chosen independently of the construction of the furniture assembly.

In at least one embodiment of the presence detection system, the at least one electrically conducting element is the at least one steady element and/or the at least one movable element itself. An advantage of this implementation is that no additional elements are needed.

In at least one embodiment of the presence detection system, the at least one control unit is further arranged to dynamically compute the predetermined capacitance threshold value from the at least one electrically conducting element from at least one previously determined capacitance value of the at least one electrically conducting element during an adjustment of the at least one movable element. The control unit is further arranged to provide the control signal when the capacitance detecting unit detects a capacitance value higher than the dynamically computed predetermined capacitance threshold.

The capacitance values of the electrically conducting elements change during the adjustment of the movable elements due to the changing orientation between the movable elements and the steady elements. An advantage of dynamically computing the predetermined capacitance threshold value is that if the predetermined capacitance threshold value is computed from at least one previously determined capacitance value of the at least one electrically conducting element, the shifting of the capacitance value during an adjustment can be taken into account. The presence detection system furthermore adjusts automatically to capacitive influences from the surroundings of the furniture assembly.

In at least one embodiment of the presence detection system, the at least one control unit is further arranged to compute the predetermined capacitance threshold value for the at least one electrically conducting element from a mean value of previously determined capacitance values of the at least one electrically conducting element during an electrical adjustment of the at least one movable element. An advantage of using the mean value of previously determined capacitance values is that sudden changes of the capacitance value, such as an approaching hand of a person, is not taken into account while computing the capacitance threshold value. Therefore, a sudden change of the capacitance value due to the approaching hand can be reliably detected by the presence detection system.

In at least one embodiment, the control unit is arranged to compute the predetermined capacitance threshold value from a sum of the mean value of previously determined capacitance values and a fixed offset. The offset can be chosen in any suitable way so that a pinching situation of a person or an animal can be reliably detected.

In at least one embodiment, the electric connection between the capacitance detecting unit and the at least one control unit comprises a data bus.

In at least one embodiment, the at least one electrically conducting element is divided into at least two electrically conducting zones which are galvanically separated from each other. The capacitance detecting unit is arranged to detect a capacitance value of each electrically conducting zone independently. Dividing one electrically conducting element into at least two electrically conducting zones enhances the accuracy of the presence detection. In this case, a capacitance value is detected for each electrically conducting zone, which provides a higher sensitivity. Each zone has a smaller surface and thus a smaller capacity than the entire conducting element. Therefore, each zone is exposed to less disturbances from parasitic effects and an approaching hand of a person results in a bigger change of its capacitance value which can more reliably be detected.

In at least one embodiment, the at least one control unit is further arranged to detect a disruption of the electrical connection between the at least one capacitance detecting unit and the at least one electrically conducting element and/or between the at least one control unit and the at least one capacitance detecting unit. A disruption of such electrical connection causes, for example, a significant decrease of the respective capacitance value. This way, a disruption of at least one of the electrical connections can be detected by the control unit. Hence, the control unit can signal to a user of the furniture assembly, that an adjustment of the furniture assembly is not protected by the presence detection system. Alternatively, the control unit may prohibit an adjustment of the furniture assembly if a disruption of an electrical connection has been detected.

In one embodiment, the control unit and/or the capacitance detecting unit is arranged to process the determined capacitance value of at least one electrically conducting element with a Fourier transformation.

According to a second aspect, a method of presence detection with an electrically adjustable furniture assembly is disclosed. The method comprises the steps of:
  detecting, by a capacitance detecting unit, a capacitance value of at least one electrically conducting element of at least one steady element and/or at least one movable element of the electrically adjustable furniture assembly,
  providing, by a control unit, a control signal to stop and/or reverse an adjusting movement at least in part, the adjusting movement being performed by at least one actuator used to electrically adjust at least one movable element, when a capacitance value higher than a predetermined capacitance threshold value of at least one electrically conducting element is detected by the capacitance detecting unit.

In one embodiment, the step of detecting a capacitance value comprises:
  determining a time until the at least one electrically conducting element is charged with a predetermined voltage value, and
  determining the capacitance value based on the determined time.

In one embodiment, the step of detecting a capacitance value comprises:
  repeatedly charging at least one of the electrically conducting elements with a predetermined voltage value;
  repeatedly transferring an electric charge of the at least one electrically conducting element to a capacitor until a predetermined electric charge is detected on the capacitor,
  determining a number of repetitions of transferring the electric charge to the capacitor,
  determining the capacitance value based on the determined number of repetitions.

BRIEF DESCRIPTION OF THE DRAWINGS

Further embodiments are disclosed in the following detailed description of exemplary embodiments. The exemplary embodiments are described with respect to the attached figures. In the figures, the same reference signs are used for elements with generally the same function. Those elements, however, do not have to be identical in all details.

In the figures.

DETAILED DESCRIPTION

Figure 1:
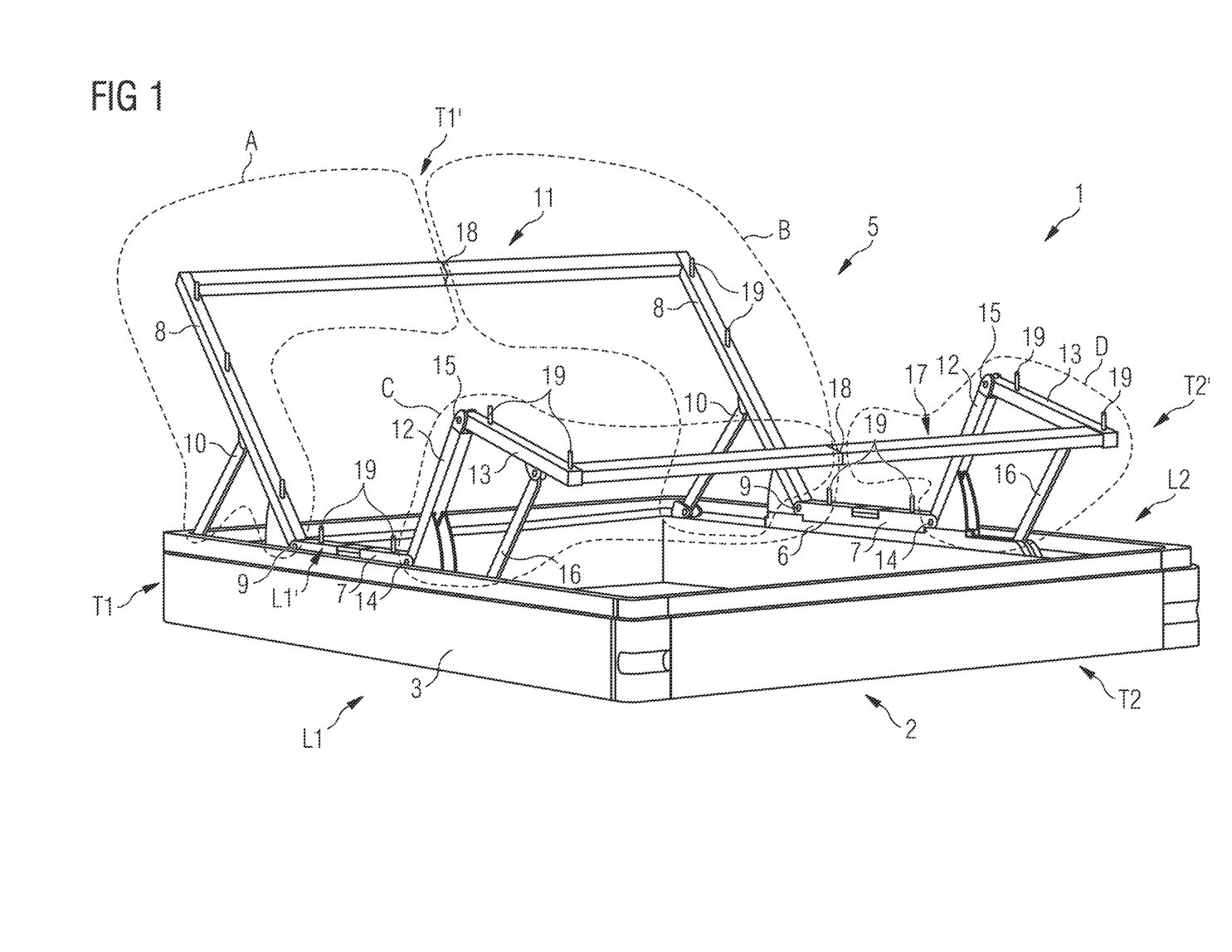
FIG. 1 shows a perspective drawing of a presence detection system for an electrically adjustable bed.

FIG. 1 shows a perspective drawing of a presence detection system 1 for an electrically adjustable bed 2. The bed 2 has a steady frame 3. The steady frame 3 has two longitudinal sides L1, L2 and two transversal sides T1, T2. On an upper end of each longitudinal side L1, L2, the steady frame 3 has a rail 4. In the rail 4, a movable frame 5 is displaceably mounted. The movable frame 5 also has two longitudinal sides L1', L2' and two transversal sides T1', T2', connecting said longitudinal sides L1', L2'. Each longitudinal side L1', L2' of the movable frame 5 has a slider 6 which is arranged to slide along the rail 4 of the steady frame 3. This way, the movable frame 5 can be displaced with respect to the steady frame 3 along the longitudinal sides L1, L2.

The movable frame 5 consists of several segments. On each longitudinal side L1', L2', the movable frame 5 has first segments 7, which are fixed in parallel to the slider 6. Towards the transversal side T1', on a bed-head unit of the bed 2, each longitudinal side L1', L2' has a second segment 8, which is each articulatedly connected to the first segments 7. The first segments 7 and the second segments 8 are connected via first hinges 9. The second segments 8 are additionally supported by first lever arms 10, which are slidably connected to the rail 4 of the steady frame 3. Along the transversal side T1' of the bed-head unit, the second segments 8 are connected via a third segment 11.

Towards the transversal side T2', on a bottom end unit of the bed 2, each longitudinal side L1', L2' has a fourth segment 12 and a fifth segment 13. The fourth segments 12 are articulatedly connected to the first segments 7. The fifth segments 13 are articulatedly connected to the fourth segments 12. The connection between the first segments 7 and the fourth segments 12 are second hinges 14. The connection between the fourth segments 12 and the fifth segments 13 are third hinges 15. The fifth segments 13 are additionally supported by second lever arms 16 which are articulatedly connected to the slider 6. Along the transversal side T2' of the bottom end unit, the fifth segments 13 are connected via a sixth segment 17.

On the first, the second, the fourth and the fifth segment 7, 8, 12, 13, connectors 19 are mounted to a side of the segments 7, 8, 12, 13 which faces away from the steady frame 3. Those connectors 19 are used to mount bed plates to the movable frame 5. The bed plates are used as support for a mattress.

The movable frame 5 can be electrically adjusted with actuators, which are not visible in FIG. 1. The electrical adjustment of the above described segments 7, 8, 11, 12, 13, 17 and the second lever arms 16 and the displacement of the slider 6 and the first lever arms 10 causes a risk for pinching, if a person approaches, for example with a hand, the movable frame 5 or the steady frame 3 in dangerous-areas, where the movable frame 5 approaches the steady frame 3, during said adjustment. For example, areas between the steady frame 3 and the moving frame 5, between the first and second lever arms 10, 16 and other parts of the movable and/or steady frame 5, 3, the hinges 9, 14, 15 and the slider 6 are dangerous during an electrical adjustment. However, pinching may also occur during an electrical adjustment of the movable frame 5 between the movable frame 5 and surrounding objects, for example a wall.

To avoid harm in case a person approaches said dangerous areas, the bed 2 is provided with a system to detect such situations. To detect a presence of a person in this embodiment, capacitance values of the movable frame 5 are monitored with capacitance detecting units. The movable frame 5 is electrically conducting. Those capacitance detecting units, which are not shown in FIG. 1, may be chips measuring the capacitance values as described in more detail below. If a person touches, for example with a hand, the electrically conducting movable frame 5, the capacitance value of the movable frame 5 changes and the presence detection system 1 is triggered.

In the embodiment of FIG. 1, the movable frame 5 is divided into 4 zones A, B, C, D and for each zone A, B, C, D, the respective capacitance value is measured independently by a separate chip or by separate channels of a single chip or a combination thereof. Separating the movable frame 5 into several conducting zones which are monitored separately achieves a higher sensitivity of the presence detection system 1. A higher sensitivity is for example advantageous, because not only a direct contact of, for example, a hand with the movable frame 5 can be detected, but also if the hand approaches rather close to the movable frame 5 so that a pinching of the hand may be imminent. Also, it can be more precisely determined, where the hand touched or approached the movable frame 5.

The first zone A and the second zone B each include one second segment 8, one first lever arm 10 and half of the third segment 11. The third zone C and the fourth zone D each include one fourth segment 12, one fifth segment 13, one second lever arm 16 and half of the sixth segment 17. Elements of the same zone are electrically connected. Each zone A, B, C, D is electrically conducting and galvanically separated from the other zones A, B, C, D and the steady frame 3. Alternatively, the movable frame 5 may of course also be separated into less or more than four electrically conducting zones.

Figure 2:
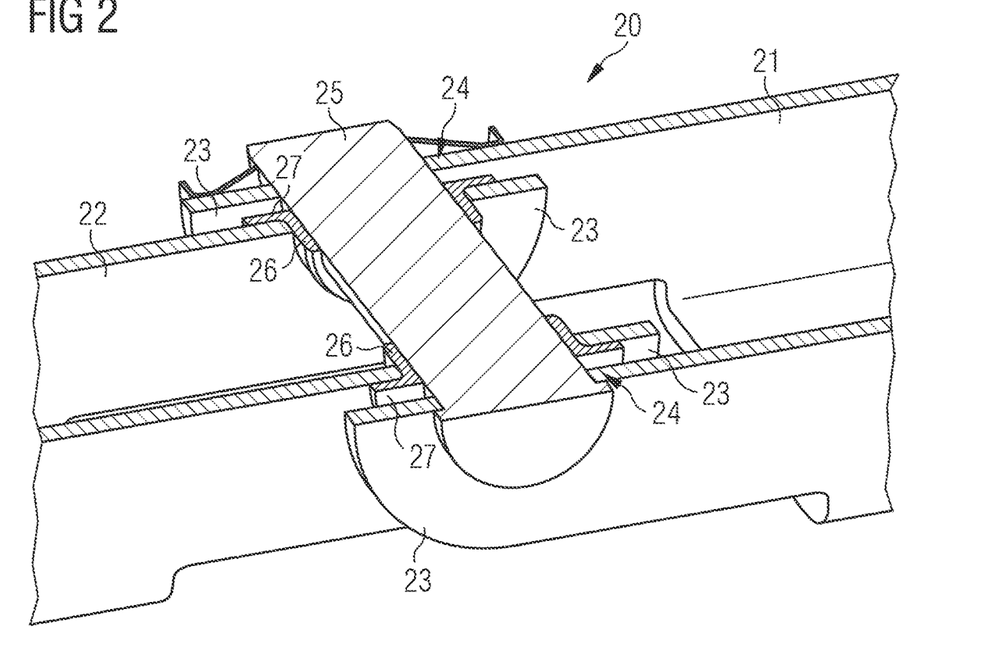
FIG. 2 shows a cross section of a galvanically isolating hinge.

The third and the sixth segment 11, 17 are each divided into two electrically conducting parts by galvanic separators 18. Those separators 18 are plastic parts, inserted into the transversal sides T1', T2' of the movable frame 5. The zones A, B, C, D are galvanically separated from the steady frame 3 and the slider 6 via galvanically separating hinges. An exemplary embodiment of such hinges, e.g. for the first hinges 9 and the second hinges 14, is shown in FIG. 2.

In this embodiment, to monitor the capacitance values of the electrically conducting zones A, B, C, D, for example, the chips may charge each zone with a predetermined voltage. Each zone A, B, C, D of the movable frame 5 therefore functions as a sensor in this embodiment. The capacitance value of each zone A, B, C, D then can be determined for example by measuring a time, how long it takes, until each zone A, B, C, D is charged by the predetermined voltage to a predetermined voltage value. If a person approached or touched one of the zones A, B, C, D, the charging of the respective zone A, B, C, D would take longer. From the time it takes to charge the zones A, B, C, D to the predetermined voltage value, the chip derives the capacitance value for each zone A, B, C, D. This process is performed repeatedly, for example, 50 times per second. Alternatively, a time to discharge the zones A, B, C, D may be measured and the capacity value be derived from a time it takes until the respective zone A, B, C, D is discharged.

Alternatively, one of the zones A, B, C, D may be charged to a predetermined voltage value and the voltage of that zone then be transferred to a capacitor with a known capacitance. This step is repeated until a predefined voltage value can be measured on the capacitor. Depending on a number of repetitions, the capacitance value of the respective zone can then be determined. Further methods to determine the capacitance value of each zone A, B, C, D, however, are possible.

The determined capacitance value of each zone A, B, C, D are provided from the chips to a control unit. In this embodiment, the capacitance value from each zone A, B, C, D is provided from the chips to the control unit via a data bus as digital values of e.g. 16 bit. The control unit filters the received data with a low-pass filter to minimize noise produced by the actuators and other influences. Cables to connect the sensor zones A, B, C, D to the chips and to connect the chips to the control unit are running within the segments 7, 8, 11, 12, 13, 17, which are hollow. In this embodiment, the chips and the control unit are mounted in one of the sliders 6, either on the longitudinal side L1' or the longitudinal side L2'. Alternatively, also more than one control unit may be used and the control units and/or chips may be arranged separately in both sliders 6 or other parts of the movable frame. Arranging those elements in the movable frame is advantageous since no complex cabling between the movable and steady parts of the frame is needed. However, those elements may also be arranged inside or attached to any other part of the electrically adjustable bed 2.

The control unit is also not visible in FIG. 1. The control unit compares the received capacitance value of each zone A, B, C, D with predetermined capacitance threshold values. If the control unit detects that a capacitance value of one of the zones A, B, C, D is higher than its respective predetermined capacitance threshold value, the presence detection system is triggered and it is assumed, that a person has touched or approached closely one of the zones A, B, C, D.

The control unit then provides a control signal to the actuator to stop and/or to reverse at least partially the adjusting movement, during which the presence of a person was detected. The predetermined threshold value is further described with respect to FIGS. 5 and 6. The capacitance values of the zones A, B, C, D may be evaluated separately or combined. If the zones are evaluated separately, it is for example possible, to only stop an adjusting movement of the bed head unit, if a touch was detected in zone A or zone B, even though the entire movable frame 5 performs an adjusting movement. Alternatively, all adjusting movements may be stopped.

By stopping and/or reversing at least partially a movement of the movable frame 5 when the presence detection system 1 is triggered, a pinching of a person which may have approached, with, for example a hand, one of the dangerous areas, is prevented.

The control unit additionally can be used to monitor the electrical connection between the control unit and the chip and/or between the chip and the zones A, B, C, D. For example, a disruption of the electrical connection can be detected and signalized to a user when a decrease of the capacitance value of a zone A, B, C, D is detected. Alternatively, when such disruption is detected, the presence detection system may prohibit any adjusting movements.

Additionally, further sensors to detect pressure may be attached to the movable frame 5. Such sensors change a capacitance value when a force is applied to the sensor. Those sensors may also provide their capacitance value to the control unit. Since the control unit is anyway arranged to monitor capacitance values, the data of those additional sensors can be evaluated by the control unit the same way as the capacitance values of the electrically conducting zones A, B, C, D. With such additional sensors, a horizontal and/or vertical force to the movable frame 5 may be detected. A contact of a part of the movable frame 5 with, for example, a wall during an adjusting movement can be detected with those additional sensors. The control unit can then stop and/or reverse at least partially the adjusting movement.

The presence detection system disclosed in this embodiment for an electrically adjustable bed may similarly be implemented, for example, for an electrically adjustable sofa, an electrically adjustable recliner or any other electrically adjustable furniture assembly.

FIG. 2 shows a cross section of a galvanically separating hinge 20. Those galvanically separating hinges may, for example, be used as the first hinge 9 and/or the second hinge 14 of the electrically adjustable bed 2 according to FIG. 1. In an alternative embodiment to the one of FIG. 1, in which also the third hinges 15 are galvanically separating hinges, the hinge shown in FIG. 2 may also be used as a third hinge 15.

The hinge 20 articulatedly connects a first element 21 and a second element 22 of a movable frame, such as the movable frame 5 of FIG. 1. The first and the second element 21, 22 are made of electrically conducting material.

The first and the second element 21, 22 each have two parallel lugs 23. The lugs 23 of the second element 22 have a smaller distance from each other than the lugs 23 of the first element 21 so that the lugs 23 of the second element 22 are arranged between the lugs 23 of the first element 21. The lugs 23 of the first element 21 and the second element 22 have concentric openings 24. In the openings 24, a bolt 25 is mounted. The openings 24 of the first element 21 have a diameter so that the bolt 25 is mounted accurately fitting in the openings 24. The openings 24 of the second element 22 have a slightly bigger diameter. Between the second element 22 and the bolt 25, bearings 26 are mounted so that the bearings 26 are accurately fitting between the lugs 23 of the second element 22 and the bolt 25.

The bearings 26 are made of an electrically isolating material so that they galvanically separate the second element 22 from the first element 21. Additionally or alternatively, also the bolt 25 can be made of an electrically isolating material. If the bolt 25 is made of an electrically isolating material, for example ceramics, the isolating bearings 26 may be omitted. Alternatively, a bolt 26 made of metal, for example, may be provided with an isolating outer layer. To prevent a direct contact between the lugs 23 of the first element 21 and the lugs 23 of the second element 22, the galvanically separating bearings 26 each have a flange 27 on the side, where the lugs 23 of the second element 22 face the lugs 23 of the first element 21.

Figure 3:
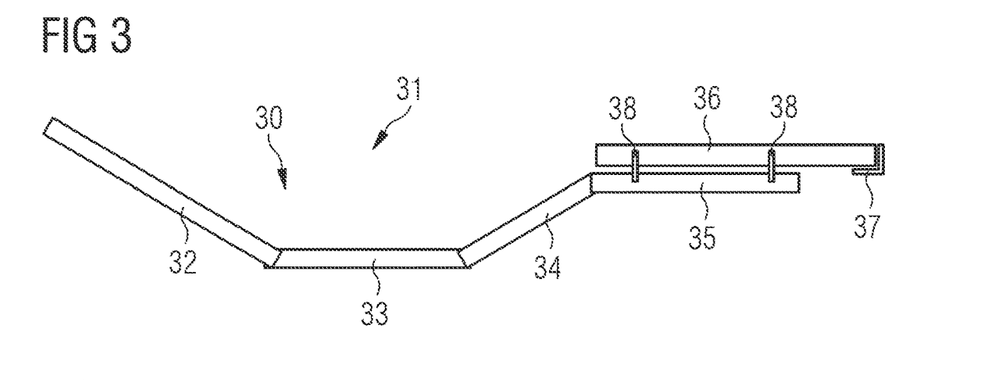
FIG. 3 shows a schematic drawing of a presence detection system for an electrically adjustable bed.
Figure 4:
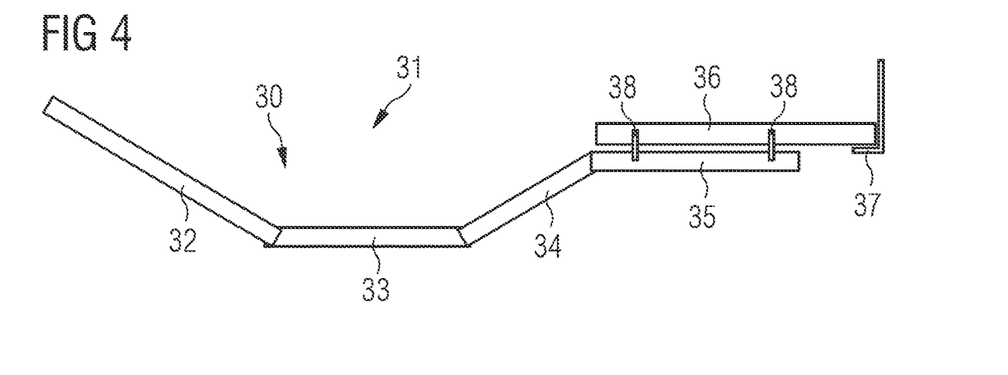
FIG. 4 shows a schematic drawing of a presence detection system for an electrically adjustable bed according to a further embodiment.

FIGS. 3 and 4 show schematic drawings of embodiments of a presence detection system for an electrically adjustable bed.

Figure 7:
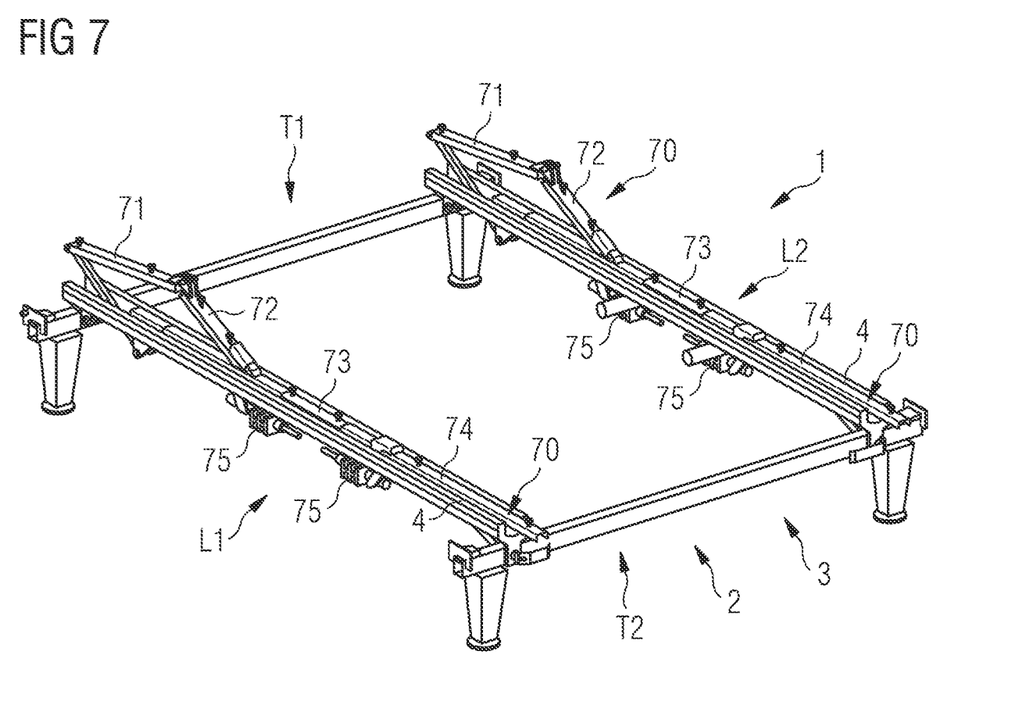
FIG. 7 shows a perspective drawing of a presence detection system for an electrically adjustable bed.

Both FIGS. 3, 4 show a movable frame 30 of an electrically adjustable bed 31 in a side view. The movable frame 30 has frame segments 32, 33, 34, 35. On the bottom end unit, i.e. on frame segment 35, a bed plate 36 is mounted. Similar bed plates can be mounted on the other frame segments 32, 33, 34 as well. Such bed plates support, for example, a mattress of the bed 31. The segments 32, 33, 34, 35 resemble in general the segments 7, 8, 12, 13 of the embodiment of FIG. 1. However, in the embodiment of FIGS. 3 and 4, the segments 32, 33, 34, 35 are not necessarily electrically conducting and they are not used as sensors for monitoring their capacitance values. Instead, in the embodiments according to FIGS. 3 and 4, an additional sensor element 37 is mounted to the bed plate 36. In case bed plates are mounted to the segments 32, 33, 34, 35, the third and sixth segments 11, 17 on the transversal sides T1', T2' of the movable frame 5, as shown in FIG. 1, may be omitted. Such an embodiment is shown in FIG. 7. In that case, the additional sensor element 37 allows a pinching protection also on the transversal sides.

In the embodiment of FIG. 3, the sensor element 37 is an L-shaped electrically conducting bar, mounted on a transversal side T2" of the bed plate 36. The L-shape makes it possible to detect a horizontal as well as a vertical touching. The sensor element 37 ends flush with an upside of the bed plate 36 and reaches underneath the bed plate 36. The bed plate 36 is made of an electrically non-conductive material, for example wood. Inside the bed plate 36 or attached to it are cables, which connect the L-shaped electrically conducting bar to plugs which are not shown in this Figure. Inside the frame elements 32, 33, 34, 35, which are formed as hollow tubes, are running isolated cables. Those cables are connected to connectors 38. The connectors 38 are mounted in the frame element 35. When the bed plate 36 is mounted to the frame elements 32, 33, 34, 35, the plugs of the bed plate 36 are connected to the connectors 38 and an electrical connection is established between the cables in the frame elements 32, 33, 34, 35 and the sensor element 37. The connection between connectors 38 and the plugs may either only provide an electrical connection or, alternatively, provide an electrical connection as well as a mechanical connection of the bed plate 36 to the frame elements 32, 33, 34, 35. The cables are then connected to capacitance detecting units according to the ones described with respect to FIG. 1. The monitoring of the capacitance value of the sensor element 37, the evaluation of those values and the stopping and/or reversing of an adjusting movement of the bed 31 may be performed identically according to the description of the embodiment of FIG. 1.

Analogously, an identical sensor element to the sensor element 37 can be mounted to a bed plate which is connectable to the head end unit of the bed, i.e. to frame element 32. Additionally, similar sensor elements may also be mounted to the bed plates on longitudinal sides of the bed plates.

The embodiment of FIG. 4 differs from the embodiment of FIG. 3 inasmuch, as the additional sensor 37, whose capacitance value is monitored, is a retainer. Such a retainer is used, to keep a mattress of the bed 31 in place. In the embodiment of FIG. 4, the L-shaped retainer is electrically conducting. Connection of the retainer and monitoring of its capacitance value may be identical to the above described embodiments. However, such retainer is usually only connected to the transversal side of the bed plate 36. Additionally to the retainer on the transversal side of the bed plate 36, two additional sensor elements in form of L-shaped bars according to the embodiment of FIG. 3 can be mounted to the longitudinal sides of the bed plate 36. Those L-shaped bar sensor elements and the retainer may also be electrically connected to form a common sensor zone.

Figure 5:
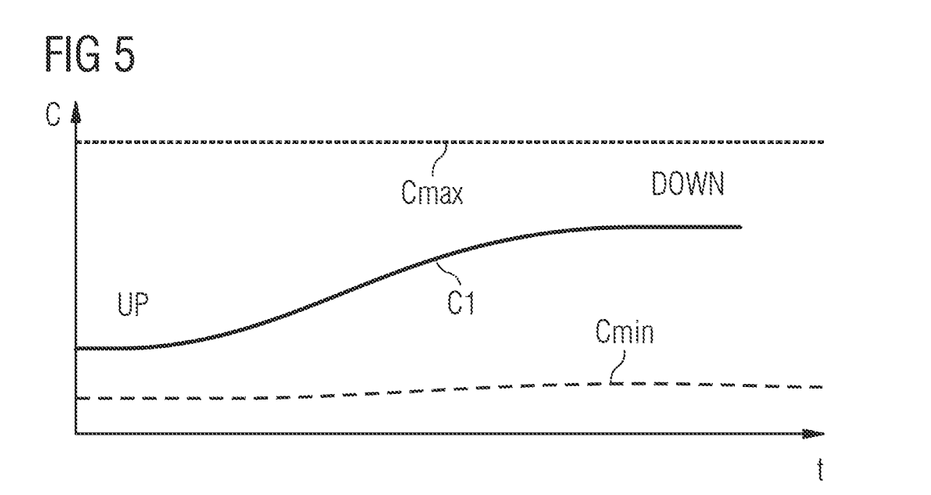
FIG. 5 shows a diagram of an evaluation of a capacitance value.
Figure 6:
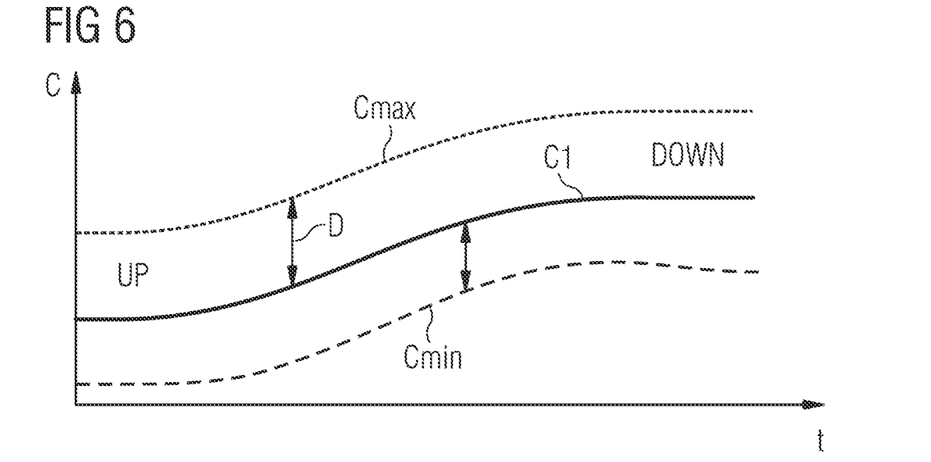
FIG. 6 shows a diagram of an evaluation of a capacitance value.

FIGS. 5 and 6 show diagrams of an evaluation of a capacitance value of a presence detection system. Both diagrams depict a capacitance value C versus a time t during an electrical adjusting movement of an electrically adjustable furniture assembly, such as, for example, one of the electrically adjustable beds of FIG. 1, 3 or 4.

Both diagrams show a movement from an elevated position ("UP") towards a horizontal position ("DOWN") of, for example, a bed head unit or a bottom unit of an electrically adjustable bed. The curve of a measured capacitance value C1 of at least one sensor or sensor zone increases during the adjusting movement. The increase of C1, shown in FIGS. 5 and 6 is caused due to the fact, that a movable part, which comprises the sensor or sensor zone, is approaching a steady part, such as the steady frame 3 shown in FIG. 1. Alternatively or additionally, the measured capacitance value may increase while the sensor or senor zone is approaching surrounding elements, such as a wall and/or, for example a heating element.

In the embodiment according to FIG. 5, a constant predetermined threshold capacitance value Cmax is used. If the measured capacitance value C1 would exceed the threshold value Cmax, a presence of a person and/or an animal, for example, would be detected and an adjusting movement would be stopped and/or reversed. This, however, causes the presence detection system to be rather inaccurate. If a presence should be reliably detected when the movable part is in the "UP" position, then, in case the movable part is closer to the "DOWN" position, already minor disturbances, which may be cause from non-dangerous measuring fluctuations, for example, would cause the adjusting movement to be stopped and/or reversed.

In the embodiment, shown in FIG. 6, a predetermined capacitance threshold value Cmax is used, which is dynamically computed from a mean value of previously measured capacitance values C1 and a constant offset D. The mean value may, for example, be determined from capacitance values C1 previously measured during a predetermined time period. This way, a presence of a person or animal may be reliably detected if the measured capacitance value C1 exceeds the threshold value Cmax, independently of a position of the movable part. The presence detection systems is triggered in the "DOWN" position as well as in the "UP" position, in case the measured capacitance value C1 suddenly increases more than the offset value D. The offset value D may be ideally chosen to reliably detect a person or animal approaching a dangerous zone, but avoid false alarms of the detection system, caused, for example, by measurement fluctuations or other non-dangerous events.

As described above, also a disruption of electrical connections in the presence detection system may be detected from a sudden decrease of the measured capacitance value. To detect such decrease, a constant minimum capacitance threshold value Cmin, as shown in FIG. 5 may be used. If the measured capacitance value C1 falls below the minimum threshold value Cmin, a disruption of an electrical connection is detected. Alternatively, as shown in FIG. 6, the minimum threshold value may also be computed dynamically from a mean value of previously measured capacitance values C1 and a negative offset.

Additionally or alternatively, the measured capacitance values may be carved up into a frequency spectrum with a fast Fourier transform algorithm. Then, the frequency components of the frequency spectrum may be analyzed. A touch and/or approach of a person or animal causes an abrupt change of the measured capacitance value. A change of high frequency components can be expected. Such change can therefore also be used as a trigger for the presence detection system according to any of the embodiments of FIGS. 1, 3 and 4.

FIG. 7 shows a perspective drawing of another embodiment of a presence detection system 1 for an electrically adjustable bed 2. The electrically adjustable bed 2 comprises a steady frame 3. On the longitudinal sides L1 and L2, the steady frame 3 has rails 4, in which kinematic elements 70 are slidably arranged on an upper side. Each kinematic element 70 comprises four segments 71, 72, 73, 74. Each segment 71, 72, 73, 74 is articulatedly connected with its adjacent segments 71, 72, 73, 74. The function of those segments 71, 72, 73, 74 is identical with the function of the first, second, fourth and fifth segment 7, 8, 12, 13 of the embodiment of FIG. 1 and the frame segments 32, 33, 34, 35 of the embodiment of FIGS. 3 and 4.

In the embodiment of FIG. 7, no movable segments are arranged on the transversal sides T1 and T2 of the electrically adjustable bed 2. Bed plates, as shown in FIGS. 3 and 4 can be mounted to the kinematic elements 70. In this embodiment, however, no frame elements are present on the transversal sides T1 and T2, which may be used as sensor elements for the presence detection. Therefore, additional sensor elements, mountable to the bed plates as shown in FIGS. 3 and 4, are advantageous in this case.

On a bottom side of the longitudinal sides L1 and L2, FIG. 7 shows actuators 75 which induce a sliding movement of the kinematic elements 70 along the rails 4 as well as a vertical adjustment of the segments 71, 72, 73, 74. Presence detection of a person and/or animal may be performed in this embodiment analogously to the above described presence detection mechanisms of FIGS. 1-6.

Figure 8:
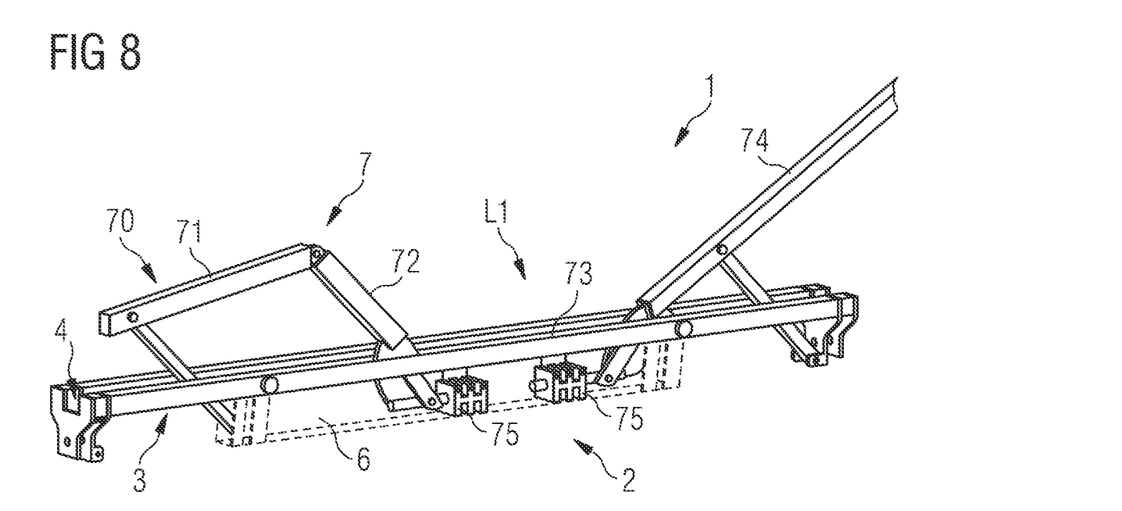
FIG. 8 shows a perspective drawing of a part of a presence detection system for an electrically adjustable bed.

FIG. 8 shows a part of a longitudinal side L1 of an electrically adjustable bed 2 with a kinematic element 70. The embodiment of FIG. 8 is similar to the embodiment of FIG. 7. The actuators 75 are arranged in a slider 6, similar to the slider 6, shown in FIG. 1. Inside the slider 6, also capacitance detecting units and a control unit, as described with respect to FIGS. 1-6, may be arranged. Presence detection of a person and/or animal may be performed in this embodiment analogously to the above described presence detection mechanisms of FIGS. 1-7.

We claim:

1. A presence detection system for an electrically adjustable furniture assembly, comprising:
at least one steady element and at least one movable element, articulatedly and/or slidably connected to the at least one steady element, wherein the at least one steady element and/or the at least one movable element comprises an electrically conducting element;
at least one actuator, arranged to electrically adjust the at least movable element;
at least one capacitance detecting unit, electrically connected to the electrically conducting element, arranged to detect a capacitance value of the electrically conducting element; and
at least one control unit, electrically connected to the at least one actuator and the at least one capacitance detecting unit,
wherein the at least one control unit is arranged to provide a control signal to stop and/or reverse an adjusting movement at least in part when the at least one capacitance detecting unit detects a capacitance value of the electrically conducting element higher than a predetermined capacitance threshold value, and the at least one control unit is further arranged to dynamically compute the predetermined capacitance threshold value for the electrically conducting element from at least one previously determined capacitance value of the electrically conducting element during an adjustment of the at least one moveable element and to provide the control signal when the capacitance detecting unit detects the capacitance value higher than the dynamically computed predetermined capacitance threshold value.

2. The presence detection system according to claim 1, wherein the electrically adjustable furniture assembly is one of the following:
an electrically adjustable bed;
an electrically adjustable sofa; and
an electrically adjustable recliner.

3. The presence detection system according to claim 1, wherein the electrically conducting element is an additional element, attached to the at least one steady element and/or the at least one movable element.

4. The presence detection system according to claim 1, wherein the electrically conducting element is the at least one steady element and/or the at least one movable element itself.

5. The presence detection system according to claim 1, wherein the at least one control unit is further arranged to compute the predetermined capacitance threshold value for the electrically conducting element from a mean value of previously determined capacitance values of the electrically conducting element during an electrical adjustment of the at least one movable element.

6. The presence detection system according to claim 5, wherein the at least one control unit is arranged to compute the predetermined capacitance threshold value from a sum of the mean value of previously determined capacitance values and a fixed offset.

7. The presence detection system according to claim 1, wherein the electric connection between the at least one capacitance detecting unit and the at least one control unit comprises a data bus.

8. The presence detection system according to claim 1, wherein the electrically conducting element is divided into at least two electrically conducting zones which are galvanically separated from each other and the capacitance detecting unit is arranged to detect a capacitance value of each of the at least two electrically conducting zones independently.

9. The presence detection system according to claim 1, wherein the at least one control unit is further arranged to detect a disruption of the electrical connection between the at least one capacitance detecting unit and the electrically conducting element and/or between the at least one control unit and the at least one capacitance detecting unit.

10. The presence detection system according to claim 1, wherein the at least one control unit and/or the at least one capacitance detecting unit is arranged to process the determined capacitance value of the electrically conducting element with a Fourier-Transformation.

11. A method of presence detection with an electrically adjustable furniture assembly comprising the steps of:
detecting, by a capacitance detecting unit, a capacitance value of at least one electrically conducting element of at least one steady element and/or at least one movable element of the electrically adjustable furniture assembly; and
providing, by a control unit, a control signal to stop and/or reverse an adjusting movement at least in part, the adjusting movement being performed by at least one actuator used to electrically adjust the at least one movable element, when a capacitance value higher than a predetermined capacitance threshold value of the at least one electrically conducting element is detected by the capacitance detecting unit,
wherein the predetermined capacitance threshold value for the at least one electrically conducting element is dynamically computed by the control unit from at least one previously determined capacitance value of the at least one electrically conducting element during an adjustment of the at least one moveable element and wherein the control signal is provided, by the control unit, when the capacitance detecting unit detects a capacitance value higher than the dynamically computed predetermined capacitance threshold value.

12. The method according to claim 11, wherein the predetermined capacitance threshold value for the at least one electrically conducting element is computed from a mean value of previously determined capacitance values of the at least one electrically conducting element during an electrical adjustment of the at least one movable element.

13. The method according to claim 12, wherein the predetermined capacitance threshold value is computed from a sum of the mean value of previously determined capacitance values and a fixed offset.

14. The method according to claim 11, wherein the step of detecting a capacitance value comprises:
determining a time until the at least one electrically conducting element is charged with a predetermined voltage value; and
determining the capacitance value based on the determined time.

15. The method according to claim 11, wherein the step of detecting a capacitance value comprises:
repeatedly charging the at least electrically conducting element with a predetermined voltage value;
repeatedly transferring an electric charge of the at least one electrically conducting element to a capacitor until a predetermined electric charge is detected on the capacitor;
determining a number of repetitions of transferring the electric charge to the capacitor; and determining the capacitance value based on the determined number of repetitions.

\* \* \* \* \*